United States Patent [19]

Willer et al.

[11] 4,414,513
[45] Nov. 8, 1983

[54] AMPLIFIER STAGE FOR PULSE-WIDTH-MODULATED SIGNALS

[75] Inventors: Walter Willer, Statzendorf; Peter Fuchs, Vienna, both of Austria

[73] Assignee: Siemens Aktiengesellschaft, Berlin and Munich, Fed. Rep. of Germany

[21] Appl. No.: 254,867

[22] Filed: Apr. 16, 1981

[30] Foreign Application Priority Data

Apr. 18, 1980 [AT] Austria .................................. 2099/80

[51] Int. Cl.³ .............................................. H03F 1/02
[52] U.S. Cl. ...................................... 330/204; 330/10
[58] Field of Search ................. 330/10, 128, 134, 140, 330/202, 203, 204, 207 A

[56] References Cited

U.S. PATENT DOCUMENTS 4,152,661  5/1979  Zeis ...................................... 330/202

Primary Examiner—James B. Mullins
Attorney, Agent, or Firm—Herbert L. Lerner; Laurence A. Greenberg

[57] ABSTRACT

Circuit stage for the optimal driving and very highly efficient operation of a tetrode having a control grid and a plate, including a grid voltage source including two partial voltage sources being connected together at a common junction point with opposite polarity with respect to the control grid, and a control diode connected between the common junction point and the plate.

2 Claims, 2 Drawing Figures

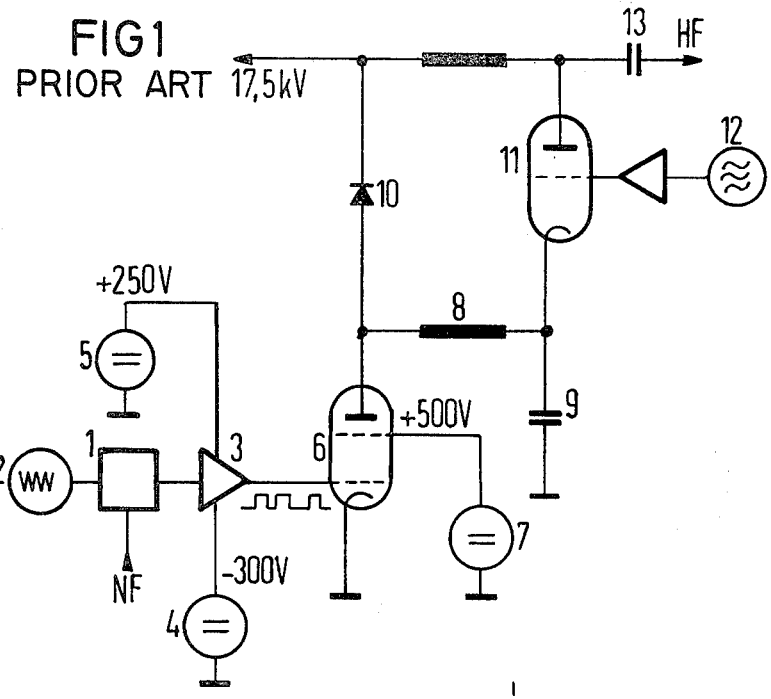
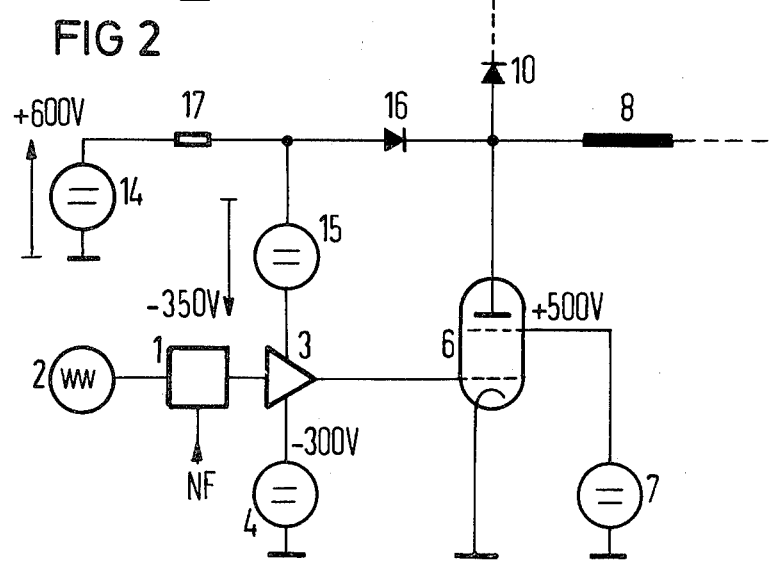

AMPLIFIER STAGE FOR PULSE-WIDTH-MODULATED SIGNALS

The invention relates to a circuit stage for driving a tetrode wherein the tube can be utilized optimally and operates with very high efficiency.

In the construction of amplifier tubes for pulse operation (switching operation), the grid voltages must be assigned in accordance with the maximum and the minimum plate current which, however, leads to overloading of the grids of the tube as well as to unnecessary plate losses for intermediate values of the plate current.

It is accordingly an object of the invention to provide an amplifier stage for pulse-width-modulated signals, which overcomes the hereinafore-mentioned disadvantages of the heretofore-known devices of this general type.

With the foregoing and other objects in view there is provided, in accordance with the invention, an amplifier stage or circuit stage for the optimal driving and very highly efficient operation of a tetrode having a control grid and a plate, the control grid of which is connected to a grid voltage source in the rhythm of the modulated pulses comprising a grid voltage source including two partial voltage sources being connected together at a common junction point with opposite polarity or in opposing sense with respect to the control grid, and a control diode connected between the common junction point and the plate of the amplifier tube.

In accordance with a concomitant feature of the invention, there is provided a resistor connected between one of the partial voltage sources and the common junction point, in order to facilitate matching to the family of characteristic curves of the amplifier tube.

Other features which are considered as characteristic for the invention are set forth in the appended claims.

Although the invention is illustrated and described herein as embodied in an amplifier stage for pulse-width-modulated signals, it is nevertheless not intended to be limited to the details shown, since various modification and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a schematic circuit diagram of a transmitter of conventional construction with an amplifier stage for pulse-width-modulated signals; and FIG. 2 is a view similar to FIG. 1 of an embodiment of the invention.

Referring now to the figures of the drawing and first particularly to FIG. 1 thereof, it is seen that from the low-frequency signal NF to be transmitted, a series of pulses which is width-modulated with the low-frequency signal and is fed to the input of a switching amplifier 3, is obtained in a modulator 1 with the aid of triangular pulses generated in a pulse generator 2. During the pulse intervals, the switching amplifier 3 applies a d-c voltage of −300 V, which is generated by a d-c voltage source 4, to the control grid of a tetrode 6 of an amplifier stage. During the pulses, a d-c voltage of +250 V generated by a further d-c voltage source 5 is applied by the amplifier 3. The screen grid voltage of +500 V of the tetrode 6 is applied by a d-c voltage source 7. The tetrode 6 delivers the amplified pulses applied to the control grid to a low-pass filter which is indicated by a coil 8 and a capacitor 9. A bypass diode 10 discharges the coil 8 if the tetrode 6 is cut off. The low-pass filter suppresses the switching frequencies and passes only the d-c and low frequency components of the signal to the cathode of an HF transmitting tube 11, which is supplied with the carrier frequency from a control transmitter 12. The amplitude-modulated signal is fed to a matching filter through an output coupling capacitor 13.

In this known circuit, the following difficulties arise with respect to the tetrode 6: if the positive value for the constant grid voltage (+250 V) corresponds to the maximally required current of the plate at the desired residual voltage, then the tetrode 6 is driven far too much positive at times when a small plate current prevails, and the residual voltage of the tetrode 6 would drop as a consequence far below the screen grid voltage and cause a considerable screen grid current and control grid current to flow. This results in undesirable retarding-field oscillations. If, on the other hand, the grid voltage is chosen too low, too high a residual voltage results at the tetrode which brings about undesired losses.

The embodiment example of the invention shown in FIG. 2 of the drawing seeks to overcome the above-mentioned disadvantages of the circuit of FIG. 1. An important difference from the known circuit shown in FIG. 1 is that in FIG. 2 the partial voltage source 5 in FIG. 1 is replaced by two bucking partial voltage sources 14 and 15, and that the junction between the partial voltage sources 14 and 15 is connected through a control diode 16 to the plate of the amplifier tube 6. Specifically, a resistor 17 is connected between the junction point and the partial voltage source 14.

The partial voltage source 14 has a d-c voltage of 600 V and the partial voltage source 15 has a d-c voltage of −350 V. Since the two voltage sources are connected with opposite polarity, they form a difference voltage of 250 V at the control grid of the amplifier tube 6, as the voltage source 5 does in the known circuit. If in the circuit according to the invention, however, the plate voltage drops below the value of 600 V, the diode 16 becomes conducting and lowers the voltage at the plate end of the resistor 17, so that the positive switching voltage at the amplifier 3 and therefore also at the control grid is also decreased correspondingly. Therefore, a family of characteristics which is optimum for the tube 6 is then obtained in switching operation. The residual voltage of the tube 6 remains nearly constant and therefore independent of the plate current and is specifically maintained at such a level that the grids of the tube are never overloaded, and no retarding-field oscillations occur at times of small plate current. Furthermore, intentional predistortion or superposition of low-frequency components at the grid, which had been required heretofore for the purpose of compensating distortions, become unnecessary. The tube 6 furnishes a high quality square-wave voltage, as is necessary for pulse modulation.

It is a further advantage of the invention that the screen grid no longer needs to be switched off if the plate voltage fails, since in this case the current through the anode, which pulls the grid along, is kept so small that no overload of the screen grid occurs.

With the circuit according to the invention, the rating of the amplifier tube 6 can be reduced to one quarter as compared with the conventional switching tube. The efficiency of the tube obtained is more than 95%. The residual voltage of the tube now varies only about 150 V between times of lowest and highest modulation, whereas it varied up to 1 kV in the known circuits, which also meant additional distortion of the low frequency information.

There is claimed:

1. Circuit stage for the optimal driving and very highly efficient operation of a tetrode having a control grid and a plate, comprising a grid voltage bias circuit including two partial voltage sources, one of said partial voltage sources being connected to the control grid, and said two partial voltage sources being connected together at a common junction point with opposite polarity with respect to the control grid, and a control diode connected between said common junction point and the plate.

2. Circuit stage according to claim 1, including a resistor connected between one of said partial voltage sources and said common junction point.

* * * * *